US009099249B2

United States Patent
Ahn et al.

(10) Patent No.: US 9,099,249 B2
(45) Date of Patent: *Aug. 4, 2015

(54) MULTILAYERED CERAMIC CAPACITOR, MOUNTING STRUCTURE OF CIRCUIT BOARD HAVING MULTILAYERED CERAMIC CAPACITOR THEREON, AND PACKING UNIT FOR MULTILAYERED CERAMIC CAPACITOR

(71) Applicant: SAMSUNG ELECTRO-MECHANICS CO., LTD., Suwon, Gyunggi-do (KR)

(72) Inventors: Young Ghyu Ahn, Gyunggi-do (KR); Tae Hyeok Kim, Gyunggi-do (KR); Min Cheol Park, Gyunggi-do (KR); Byoung Hwa Lee, Gyunggi-do (KR); Sang Soo Park, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 248 days.

This patent is subject to a terminal disclaimer.

(21) Appl. No.: 13/764,131

(22) Filed: Feb. 11, 2013

(65) Prior Publication Data

US 2014/0138136 A1 May 22, 2014

(30) Foreign Application Priority Data

Nov. 20, 2012 (KR) .................. 10-2012-0131644

(51) Int. Cl.
*H01G 4/30* (2006.01)
*H01G 4/06* (2006.01)
(Continued)

(52) U.S. Cl.
CPC ............. *H01G 4/30* (2013.01); *H01G 2/065* (2013.01); *H05K 3/3442* (2013.01); *H01G 4/12* (2013.01); *H05K 2201/10015* (2013.01); *H05K 2201/2045* (2013.01)

(58) Field of Classification Search
USPC .................. 361/303, 301.4, 311, 306.3
See application file for complete search history.

(56) References Cited

U.S. PATENT DOCUMENTS

| 8,638,543 B2 * | 1/2014 | Ahn et al. ............... 361/311 |
|---|---|---|
| 2008/0080121 A1 | 4/2008 | Togashi |
| 2011/0141660 A1 | 6/2011 | Jeong et al. |

(Continued)

FOREIGN PATENT DOCUMENTS

| JP | 61-183913 A | 8/1986 |
|---|---|---|
| JP | 04-302118 B2 | 10/1992 |

(Continued)

OTHER PUBLICATIONS

Japanese Office Action issued in Application No. 2013-022072 dated Nov. 26, 2013.

(Continued)

*Primary Examiner* — Eric Thomas
(74) *Attorney, Agent, or Firm* — McDermott Will & Emery LLP

(57) ABSTRACT

There is provided a multilayered ceramic capacitor, including: a ceramic body having a plurality of dielectric layers laminated therein; an active layer including a plurality of internal electrodes having the respective dielectric layers interposed therebetween; an upper cover layer; a lower cover layer; external electrodes; and a plurality of dummy electrodes, wherein, when A is defined as ½ of an overall thickness of the ceramic body, B is defined as the thickness of the lower cover layer, C is defined as ½ of an overall thickness of the active layer, and D is defined as the thickness of the upper cover layer, a ratio of deviation between a center portion of the active layer and a center portion of the ceramic body, (B+C)/A, satisfies $1.063 \leq (B+C)/A \leq 1.745$.

12 Claims, 9 Drawing Sheets

(51) Int. Cl.
*H01G 2/06* (2006.01)
*H05K 3/34* (2006.01)
*H01G 4/12* (2006.01)

(56) References Cited

U.S. PATENT DOCUMENTS

2012/0152604 A1 6/2012 Ahn et al.
2012/0300361 A1 11/2012 Togashi

FOREIGN PATENT DOCUMENTS

| JP | 05-047591 A | | 2/1993 |
| JP | 6-215978 A | | 8/1994 |
| JP | 07-329915 A | | 12/1995 |
| JP | 2002-305127 A | | 10/2002 |
| JP | 2005216955 A | * | 8/2005 |
| JP | 2008-91520 A | | 4/2008 |
| JP | 2012-134498 A | | 7/2012 |
| JP | 2012-248581 A | | 12/2012 |
| KR | 10-2011-0065625 A | | 6/2011 |

OTHER PUBLICATIONS

Notice of Office Action Korean Application No. 10-2012-0131644 dated Jan. 20, 2014 with English translation.

* cited by examiner

MULTILAYERED CERAMIC CAPACITOR, MOUNTING STRUCTURE OF CIRCUIT BOARD HAVING MULTILAYERED CERAMIC CAPACITOR THEREON, AND PACKING UNIT FOR MULTILAYERED CERAMIC CAPACITOR

CROSS-REFERENCE TO RELATED APPLICATIONS

This application claims the priority of Korean Patent Application No. 10-2012-0131644 filed on Nov. 20, 2012, in the Korean Intellectual Property Office, the disclosure of which is incorporated herein by reference.

BACKGROUND OF THE INVENTION

1. Field of the Invention

The present invention relates to a multilayered ceramic capacitor, a mounting structure of a circuit board having the multilayered ceramic capacitor thereon, and a packing unit for the multilayered ceramic capacitor.

2. Description of the Related Art

A multilayered ceramic capacitor, a multilayered chip electronic component, is a chip type condenser mounted on printed circuit boards of various electronic products, such as image devices including liquid crystal displays (LCDs) and plasma display panels (PDPs), computers, personal digital assistants (PDAs), mobile phones, and the like and implement charging or discharging of electricity.

A multilayered ceramic capacitor (MLCC) may be used as a component of various electronic products due to advantages thereof such as a small size, high capacitance, and ease of mountability.

The multilayered ceramic capacitor may have a structure in which a plurality of dielectric layers and a plurality of internal electrodes having different polarities with the dielectric layers interposed therebetween are laminated alternately with each other.

Since dielectric layers may have piezoelectric and electrostrictive properties, a piezoelectric phenomenon may occur and thus cause vibrations among the internal electrodes when AC or DC voltage is applied to the multilayered ceramic capacitor.

Such vibrations may be transferred to a printed circuit board on which the multilayered ceramic capacitor is mounted, through external electrodes of the multilayered ceramic capacitor, and the entire printed circuit board may become an acoustic reflection surface generating vibrating sound as noise.

The vibrating sound may be within an audible frequency range of 20 to 20000 Hz, and this vibrating sound provoking an unpleasant feeling in people is known as acoustic noise.

In order to reduce acoustic noise, studies have been made with regard to the direction in which internal electrodes formed in the multilayered ceramic capacitor are mounted on a printed circuit board.

More specifically, acoustic noise is further reduced when the multilayered ceramic capacitor is mounted on a printed circuit board such that internal electrodes have directionality perpendicular with respect to the printed circuit board as compared to the case in which the multilayered ceramic capacitor is mounted on the printed circuit board such that the internal electrodes are provided horizontally with respect to the printed circuit board.

However, even though the acoustic noise is measured by mounting the multilayered ceramic capacitor on the printed circuit board such that the internal electrodes are provided horizontally with respect to the printed circuit board, the noise has a predetermined level. Therefore, a method of reducing the acoustic noise is needed.

SUMMARY OF THE INVENTION

An aspect of the present invention provides a method capable of reducing noise generated due to vibrations caused by a piezoelectric phenomenon in a multilayered ceramic capacitor when the multilayered ceramic capacitor is mounted on a printed circuit board.

According to an aspect of the present invention, there is provided a multilayered ceramic capacitor, including: a ceramic body having a plurality of dielectric layers laminated therein; an active layer including a plurality of first and second internal electrodes having the respective dielectric layers interposed therebetween to form capacitance, the first and second internal electrodes being alternately exposed through both end surfaces of the ceramic body; an upper cover layer formed above the active layer; a lower cover layer formed below the active layer and having a thickness larger than a thickness of the upper cover layer; first and second external electrodes covering both end surfaces of the ceramic body; and a plurality of first and second dummy electrodes extended from the first and second external electrodes inwardly in a length direction to thereby face the first and second internal electrodes, respectively, in the active layer, wherein, when A is defined as ½ of an overall thickness of the ceramic body, B is defined as the thickness of the lower cover layer, C is defined as ½ of an overall thickness of the active layer, and D is defined as the thickness of the upper cover layer, a ratio of deviation between a center portion of the active layer and a center portion of the ceramic body, $(B+C)/A$, satisfies $1.063 \leq (B+C)/A \leq 1.745$.

Here, a ratio of the thickness (D) of the upper cover layer to the thickness (B) of the lower cover layer, $D/B$, may satisfy $0.021 \leq D/B \leq 0.425$.

Here, a ratio of the thickness (B) of the lower cover layer to ½ (A) of the overall thickness of the ceramic body, $B/A$, may satisfy $0.365 \leq B/A \leq 1.523$.

Here, a ratio of ½ (C) of the overall thickness of the active layer to the thickness (B) of the lower cover layer, $C/B$, may satisfy $0.146 \leq C/B \leq 2.176$.

The lower cover layer may include dummy patterns, the dummy patterns including first and second dummy patterns extended from the first and second external electrodes inwardly in the length direction to thereby face each other, respectively.

The first and second dummy patterns may have the same length.

Here, when E is defined as an overall thickness of the dummy patterns, a ratio of the overall thickness (E) of the dummy patterns to the thickness (B) of the lower cover layer, $E/B$, may satisfy $0.3 \leq E/B \leq 1$.

Here, points of inflection formed on respective end surfaces of the ceramic body may be formed to have a height corresponding to or lower than a center portion of the ceramic body in a thickness direction, due to a difference between a deformation rate occurring in the central portion of the active layer and a deformation rate occurring in the lower cover layer, during an application of voltage.

According to another aspect of the present invention, there is provided amounting structure of a circuit board having a printed circuit board having first and second electrode pads formed thereon; and a multilayered ceramic capacitor mounted on the printed circuit board, the multilayered ceramic capacitor including: a ceramic body having a plurality of dielectric layers laminated therein; an active layer including a plurality of first and second internal electrodes having the respective dielectric layers interposed therebetween to form capacitance, the first and second internal electrodes being alternately exposed through both end surfaces of the ceramic body; an upper cover layer formed above the active layer; a lower cover layer formed below the active layer and having a thickness larger than a thickness of the upper cover layer; first and second external electrodes formed on the both end surfaces of the ceramic body, electrically connected to exposed portions of the first and second internal electrodes, and connected to the first and second electrode pads through soldering; and a plurality of first and second dummy electrodes extended from the first and second external electrodes inwardly in a length direction to thereby face the first and second internal electrodes, respectively, in the active layer, wherein, when A is defined as ½ of an overall thickness of the ceramic body, B is defined as the thickness of the lower cover layer, C is defined as ½ of an overall thickness of the active layer, and D is defined as the thickness of the upper cover layer, a ratio of deviation between a center portion of the active layer and a center portion of the ceramic body, $(B+C)/A$, satisfies $1.063 \leq (B+C)/A \leq 1.745$.

The lower cover layer may include dummy patterns, the dummy patterns including first and second dummy patterns extended from the first and second external electrodes inwardly in the length direction to thereby face each other, respectively.

Here, points of inflection formed on respective end surfaces of the ceramic body may be formed to have a height corresponding to or lower than the soldering, due to a difference between a deformation rate occurring in the central portion of the active layer and a deformation rate occurring in the lower cover layer, during an application of voltage.

According to another aspect of the present invention, there is provided a packing unit for a multilayered ceramic capacitor, the packing unit including: one or more multilayered ceramic capacitors, including: a ceramic body having a plurality of dielectric layers laminated therein; an active layer including a plurality of first and second internal electrodes alternately exposed through both end surfaces of the ceramic body, having the respective dielectric layer interposed therebetween; an upper cover layer formed above the active layer; a lower cover layer formed below the active layer and having a thickness larger than a thickness of the upper cover layer; first and second external electrodes formed on the both end surfaces of the ceramic body and electrically connected to exposed portions of the first and second internal electrodes; and a plurality of first and second dummy electrodes extended from the first and second external electrodes inwardly in a length direction to thereby face the first and second internal electrodes, respectively, in the active layer, wherein, when A is defined as ½ of an overall thickness of the ceramic body, B is defined as the thickness of the lower cover layer, C is defined as ½ of an overall thickness of the active layer, and D is defined as the thickness of the upper cover layer, a ratio of deviation between a center portion of the active layer and a center portion of the ceramic body, $(B+C)/A$, satisfies $1.063 \leq (B+C)/A \leq 1.745$; and a packing sheet having a plurality of receiving parts in which the multilayered ceramic capacitors are respectively received, the lower cover layer of each multilayered ceramic capacitor facing toward a bottom surface of the receiving parts.

The packing unit may further include a packing film attached to one surface of the packing sheet so as to seal the receiving parts in which the multilayered ceramic capacitors are respectively received.

The packing sheet may be wound as a reel.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
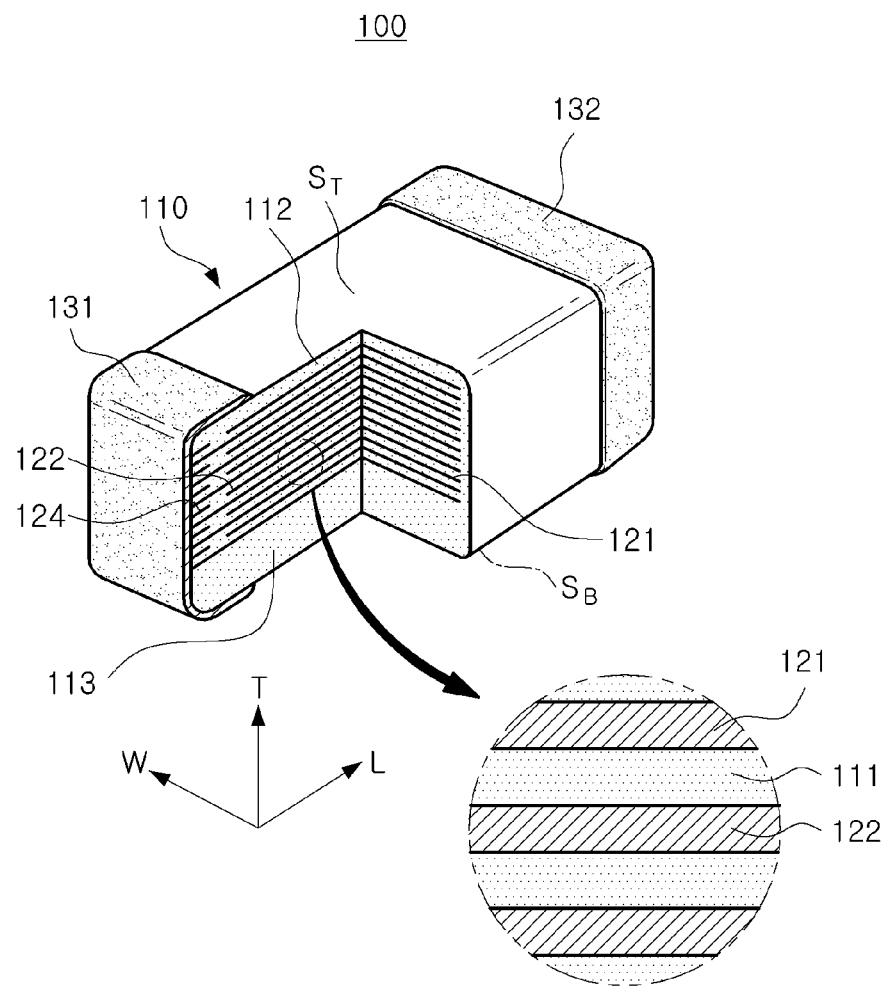
FIG. 1 is a perspective view schematically showing a multilayered ceramic capacitor according to an embodiment of the present invention of which a part is cut-away.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

When directions of a hexahedron are defined in order to clearly describe embodiments of the present invention, L, W, and T shown in the drawings indicate a length direction, a width direction, and a thickness direction, respectively. Here, the thickness direction may be used to have the same meaning as a lamination direction in which dielectric layers are laminated.

In addition, in the present embodiments, surfaces on which first and second external electrodes are formed in a length direction of a ceramic body are defined as both left and right end surfaces, and surfaces vertically crossing the left and right surfaces are defined as left and right side surfaces.

Multilayered Ceramic Capacitor

Figure 2:
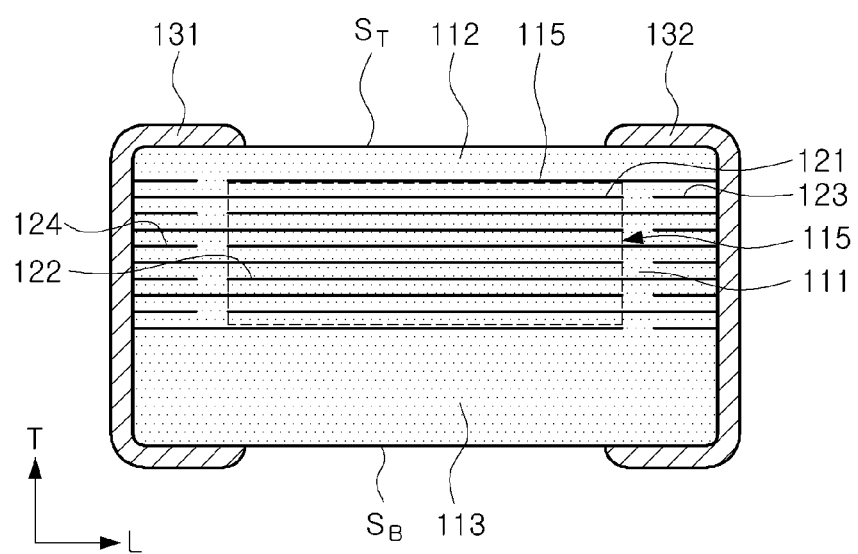
FIG. 2 is a cross-sectional view showing the multilayered ceramic capacitor of FIG. 1, cut along the length direction thereof.

Referring to FIGS. 1 and 2, a multilayered ceramic capacitor 100 according to an embodiment of the present invention may include a ceramic body 110, an active layer 115 having a plurality of first and second internal electrodes 121 and 122, upper and lower cover layers 112 and 113 respectively formed above and below the active layer 115, and first and second external electrodes 131 and 132 formed covering both end surfaces of the ceramic body 110.

A plurality of first and second dummy electrodes 123 and 124 may be formed within the active layer 115 such that they are extended from the first and second external electrodes 131 and 132 inwardly in the length direction to thereby face the first and second internal electrodes 121 and 122, respectively.

The ceramic body 110 may be formed by laminating and firing a plurality of dielectric layers 111. The shape, dimension, and number of dielectric layers 111, of the ceramic body 110, are not limited to those exemplified in the present embodiment.

The plurality of dielectric layers 111 constituting the ceramic body 110 are in a sintered state, and boundaries between adjacent dielectric layers 111 may be integrated with each other such that it is difficult to distinguish the dielectric layers 111 from each other without a scanning electron microscope (SEM).

The ceramic body 110 may include the active layer 115 contributing to capacitance formation and the upper and lower cover layers 112 and 113 formed above and below the active layer 115 as upper and lower margin parts, respectively.

The active layer 115 may be formed by repeatedly laminating the plurality of first and second internal electrodes 121 and 122 while each dielectric layer 111 is interposed between the first internal electrode and the second internal electrode.

Here, the thickness of the dielectric layer 111 may be optionally changed according to the design of capacitance of the multilayered ceramic capacitor 100, and the thickness of each dielectric layer 111 may be 0.01 to 1.00 µm after firing, but the present invention is not limited thereto.

In addition, the dielectric layer 111 may contain ceramic powder having a high dielectric constant, for example, barium titanate ($BaTiO_3$) based powder or strontium titanate ($SrTiO_3$) based powder, but the present invention is not limited thereto.

The upper and lower cover layers 112 and 113 may have the same material and constitution as the dielectric layer 111, except for whether or not internal electrodes are included.

The upper and lower cover layers 112 and 113 may be formed by laminating a single dielectric layer or two or more dielectric layers on upper and lower surfaces of the active layer 115 in upper and lower directions, respectively. The upper and lower cover layers 112 and 113 may basically serve to prevent damage of the first and second internal electrodes 121 and 122 due to physical or chemical stress.

In addition, the lower cover layer 113 may have an increased number of stacked dielectric layers as compared with the upper cover layer 112 and thus, be thicker than the upper cover layer 112.

The first and second internal electrodes 121 and 122 are a pair of electrodes having different polarities, and may be formed by printing a predetermined thickness of conductive paste containing conductive metal on each of the dielectric layers 111 while the first and second internal electrodes 121 and 122 are alternatively exposed through both end surfaces of the ceramic body 110 in the lamination direction of the dielectric layers 111. The first and second internal electrodes 121 and 122 may be electrically insulated from each other by the dielectric layers 111 disposed therebetween.

The first and second internal electrodes 121 and 122 may be electrically connected to the first and second external electrodes 131 and 132 through portions thereof alternatively exposed through both end surfaces of the ceramic body 110.

Therefore, when voltage is applied to the first and second external electrodes 131 and 132, charges are stored between the first and second internal electrodes 121 and 122 facing each other. Here, the capacitance of the multilayered ceramic capacitor 100 is proportional to an area of an overlapping region of the first and second internal electrodes 121 and 122.

The thickness of each of the first and second internal electrodes 121 and 122 may be determined depending on the usage thereof, and for example, may be determined within a range of 0.2 to 1.0 µm in consideration of the size of the ceramic body 110. However, the present invention is not limited thereto.

In addition, conductive metal contained in the conductive paste for forming the first and second internal electrodes 121 and 122 may be nickel (Ni), copper (Cu), palladium (Pd), or an alloy thereof, but the present invention is not limited thereto.

In addition, the conductive paste may be printed by a screen printing method, a gravure printing method, or the like, but the present invention is not limited thereto.

The first and second dummy electrodes 123 and 124 may be positioned on the same plane as that of the first and second internal electrodes 121 and 122 within the active layer 115. The first and second dummy electrodes 123 and 124 may be formed by printing a conductive paste containing conductive metal on the dielectric layers 111 to have a predetermined thickness through the same method as that of the first and second internal electrodes 121 and 122. Here, the first and second dummy electrodes 123 and 124 may be alternately exposed through one side surfaces of the dielectric layers 111 through which the first and second internal electrodes 121 and 122 are exposed and the other side surfaces of the dielectric layers 111.

Therefore, a gap between the first internal electrode 121 and the first dummy electrode 123 and a gap between the second internal electrode 122 and the second dummy electrode 124 may be offset in the lamination direction thereof.

When an electric field is applied to a margin part of the multilayered ceramic capacitor in the length direction, the first and second dummy electrodes 123 and 124 expand, contrary to the shrinkage of head parts of the first and second external electrodes 131 and 132 in the length direction due to the Poisson effect. Thus, the expansion may be offset by the shrinkage of the first and second external electrodes 131 and 132, and thus vibrations generating in the head parts of the first and second external electrodes 131 and 132 may be reduced, and resultantly, acoustic noise is further reduced.

The first and second external electrodes 131 and 132 may be formed of a conductive paste containing conductive metal. The conductive metal may be nickel (Ni), copper (Cu), palladium (Pd), gold (Au), or an alloy thereof, but the present invention is not limited thereto.

Hereinafter, the relationship between dimensions of components included in the multilayered ceramic capacitor 100 according to the present embodiment and acoustic noise will be described.

Figure 3:
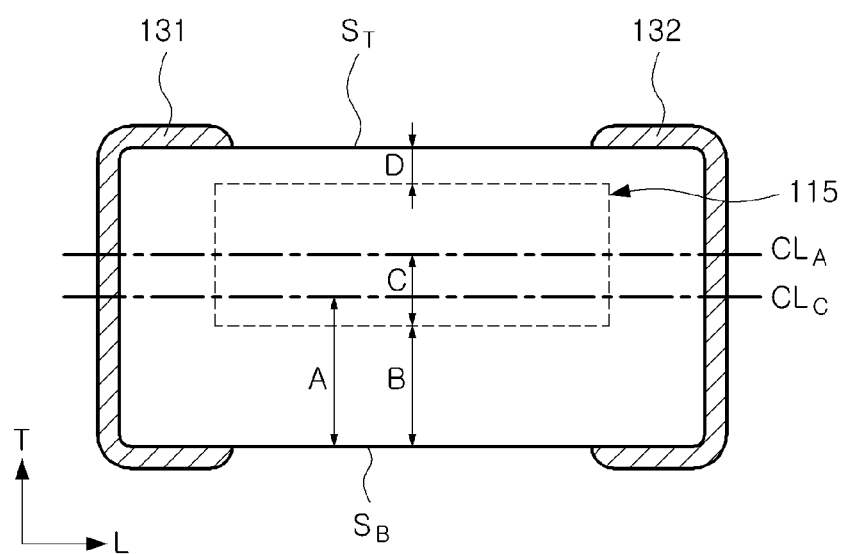
FIG. 3 is a cross-sectional view schematically showing the multilayered ceramic capacitor of FIG. 1, cut along the length direction thereof, for explaining dimensional relationships of components included in the multilayered ceramic capacitor.

Referring to FIG. 3, A is defined as ½ of an overall thickness of the ceramic body 110, B is defined as a thickness of the lower cover layer 113, C is defined as ½ of an overall thickness of the active layer 115, and D is defined as a thickness of the upper cover layer 112.

Here, the overall thickness of the ceramic body 110 means a distance from a top surface $S_T$ to a bottom surface $S_B$ of the ceramic body 110. The overall thickness of the active layer 115 means a distance from an upper surface of the first internal electrode 121 located on the uppermost portion of the active layer 115 to a lower surface of the second internal electrode 122 located on the lowermost portion of the active layer 115.

In addition, the thickness (B) of the lower cover layer 113 means a distance between the lower surface of the second internal electrode 122 located on the lowermost portion of the active layer 115 in the thickness direction to the bottom surface $S_B$ of the ceramic body 110, and the thickness (D) of the upper cover layer 112 means a distance between the upper surface of the first internal electrode 121 located on the uppermost portion of the active layer 115 in the thickness direction to the top surface $S_T$ of the ceramic body 110.

When voltages having different polarities are applied to the first and second external electrodes 131 and 132 formed on both end surfaces of the multilayered ceramic capacitor 100, the ceramic body 110 may expand or shrink in the thickness direction thereof due to an inverse piezoelectric effect of the dielectric layers 111, and both end portions of the first and second external electrodes 131 and 132 may expand and shrink, contrary to the expansion and shrinkage of the ceramic body 110 in the thickness direction, due to the Poisson effect.

Here, a central portion of the active layer 115 may maximally expand and shrink from both end portion of the first and second external electrodes 131 and 132 in the length direction, thereby causing acoustic noise.

That is, in the present embodiment, in order to reduce acoustic noise, points of inflection (PI) formed on both end surfaces of the ceramic body 110 may be formed to have a height corresponding to or lower than a center portion $CL_C$ of the ceramic body 110 in the thickness direction, due to a difference between a deformation rate occurring in a central portion $CL_A$ of the active layer 115 and a deformation rate occurring in the lower cover layer 113 because of the application of voltage.

Here, in order to further reduce acoustic noise, a ratio of deviation between the central portion $CL_A$ of the active layer 115 and the center portion $CL_C$ of the ceramic body 110, (B+C)/A, may satisfy $1.063 \leq (B+C)/A \leq 1.745$.

In addition, a ratio of the thickness (D) of the upper cover layer 112 to the thickness (B) of the lower cover layer 113, D/B, may satisfy $0.021 \leq D/B \leq 0.425$.

In addition, a ratio of the thickness (B) of the lower cover layer 113 to ½ (A) of the thickness of the ceramic body 110, B/A, may satisfy $0.365 \leq B/A \leq 1.523$.

In addition, a ratio of ½ (C) of the thickness of the active layer 115 to the thickness (B) of the lower cover layer 113, C/B, may satisfy $0.146 \leq C/B \leq 2.176$.

Modification of Multilayered Ceramic Capacitor

Figure 4:
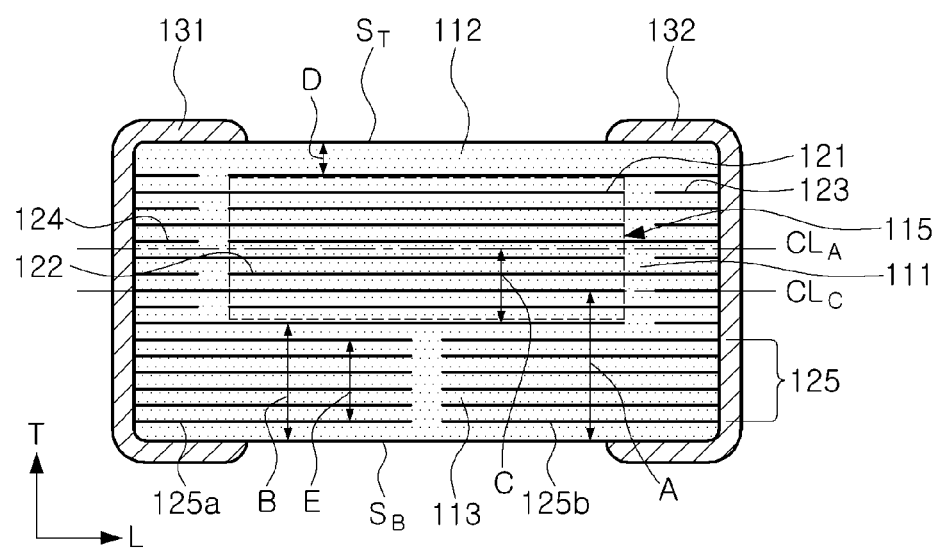
FIG. 4 is a cross-sectional view showing a multilayered ceramic capacitor according to another embodiment of the present invention, cut along the length direction thereof.

FIG. 4 shows a multilayered ceramic capacitor according to another embodiment of the present invention.

Referring to FIG. 4, a multilayered ceramic capacitor of the present embodiment may further include a plurality of dummy patterns 125 in the lower cover layer 113 in the thickness direction thereof.

The dummy patterns 125 may include first and second dummy patterns 125a and 125b extended from the first and second external electrodes 131 and 132 inwardly in the length direction to thereby face each other at a predetermined interval in the thickness direction, respectively.

Here, the respective first and second dummy patterns 125a and 125b may have the same length, and form a gap in the center of the lower cover layer 113 in the thickness direction.

When the dummy patterns 125 are further formed in the lower cover layer 113, vibrations generated in the multilayered ceramic capacitor 100 can be effectively prevented from being transferred to a printed circuit board, and thus acoustic noise can be further reduced.

Experimental Example

Each of multilayered ceramic capacitors according to the inventive examples and comparative examples of the present invention was manufactured as follows.

A slurry including powder, for example, barium titanate ($BaTiO_3$) or the like, was coated on carrier films and be then dried, to prepare a plurality of ceramic green sheets each having a thickness of 1.8 μm.

Then, a conductive paste for a nickel internal electrode was coated on the ceramic green sheets by using a screen, to form internal electrodes.

About 370 ceramic green sheets were laminated while an increased number of ceramic green sheets having no internal electrodes formed thereon as compared to ceramic green sheets having internal electrodes formed thereon were laminated downwardly of the ceramic green sheets having internal electrodes formed thereon. This laminate was subjected to isostatic pressing at 85° C. in pressure conditions of 1000 kgf/cm$^2$.

Then, The ceramic laminate after completion of pressing was cut into individual chips, and then the cut chip was subjected to debindering at 230° C. in the air atmosphere for 60 hours.

Then, the resultant chip was fired in the reducing atmosphere under an oxygen partial pressure of $10^{-11}$ atm to $10^{-10}$ atm, lower than the equilibrium oxygen partial pressure of Ni/NiO such that the internal electrodes are not oxidized at 1200° C.

Here, a chip size of the multilayered chip capacitor after firing was about 2.03 mm×1.26 mm (L×W, 2012 size). Here, tolerance was within a range of ±0.1 mm in length×width (L×W), and when the range is satisfied, acoustic noise was measured by experiments.

TABLE 1

| Sample | Dummy Electrode in Margin Part | Dummy Electrode in Lower Cover Layer | A | B | C | D | E | (B + C)/A | B/A | D/B | C/B | E/B | Acoustic Noise (dB) | Capacitance Implementation Ratio |
|---|---|---|---|---|---|---|---|---|---|---|---|---|---|---|
| 1-1 | ◯ | X | 404.9 | 40.1 | 364.8 | 40.1 | — | 1.000 | 0.099 | 1.000 | 9.097 | — | 38.9 | OK |
| 1-2 | ◯ | X | 436.7 | 70.4 | 366.4 | 70.1 | — | 1.000 | 0.161 | 0.996 | 5.205 | — | 36.2 | OK |
| 1-3 | ◯ | X | 455.4 | 89.0 | 364.9 | 92.0 | — | 0.997 | 0.195 | 1.034 | 4.100 | — | 33.7 | OK |

TABLE 1-continued

| Sample | Dummy Electrode in Margin Part | Dummy Electrode in Lower Cover Layer | A | B | C | D | E | (B + C)/A | B/A | D/B | C/B | E/B | Acoustic Noise (dB) | Capacitance Implementation Ratio |
|---|---|---|---|---|---|---|---|---|---|---|---|---|---|---|
| 1-4 | ○ | X | 509.3 | 24.5 | 361.8 | 270.4 | — | 0.759 | 0.048 | 11.037 | 14.767 | — | 41.9 | OK |
| 1-5 | ○ | X | 457.5 | 24.7 | 361.7 | 166.9 | — | 0.845 | 0.054 | 6.757 | 14.644 | — | 44.1 | OK |
| 1-6 | ○ | X | 526.9 | 30.1 | 190.9 | 641.8 | — | 0.419 | 0.057 | 21.322 | 6.342 | — | 40.2 | OK |
| 1-7 | ○ | X | 415.9 | 30.2 | 190.6 | 420.3 | — | 0.531 | 0.073 | 13.917 | 6.311 | — | 42.4 | OK |
| 1-8 | ○ | X | 516.2 | 40.3 | 360.6 | 270.8 | — | 0.777 | 0.078 | 6.720 | 8.948 | — | 38.1 | OK |
| 1-9 | ○ | X | 446.5 | 40.2 | 365.7 | 121.3 | — | 0.909 | 0.090 | 3.017 | 9.097 | — | 39.3 | OK |
| 1-10 | ○ | X | 471.1 | 41.6 | 365.7 | 169.1 | — | 0.865 | 0.088 | 4.065 | 8.791 | — | 39.4 | OK |
| 1-11 | ○ | X | 417.3 | 41.2 | 361.5 | 70.4 | — | 0.965 | 0.099 | 1.709 | 8.774 | — | 39.2 | OK |
| 1-12 | ○ | X | 427.7 | 41.0 | 359.3 | 95.8 | — | 0.936 | 0.096 | 2.337 | 8.763 | — | 38.3 | OK |
| 1-13 | ○ | X | 495.0 | 39.6 | 364.8 | 220.8 | — | 0.817 | 0.080 | 5.576 | 9.212 | — | 38.0 | OK |
| 1-14 | ○ | X | 455.2 | 25.4 | 422.0 | 41.0 | — | 0.983 | 0.056 | 1.614 | 16.614 | — | 42.3 | OK |
| 1-15 | ○ | X | 421.2 | 71.5 | 365.7 | 39.5 | — | 1.038 | 0.170 | 0.552 | 5.115 | — | 35.5 | OK |
| 1-16 | ○ | X | 431.6 | 94.4 | 364.3 | 40.1 | — | 1.063 | 0.219 | 0.425 | 3.859 | — | 29.9 | OK |
| 1-17 | ○ | X | 442.6 | 103.8 | 388.6 | 4.1 | — | 1.113 | 0.235 | 0.039 | 3.744 | — | 28.8 | OK |
| 1-18 | ○ | X | 444.6 | 120.1 | 364.5 | 40.0 | — | 1.090 | 0.270 | 0.333 | 3.035 | — | 29.8 | OK |
| 1-19 | ○ | X | 447.9 | 147.7 | 363.1 | 21.8 | — | 1.141 | 0.330 | 0.148 | 2.458 | — | 28.9 | OK |
| 1-20 | ○ | X | 452.0 | 165.0 | 359.1 | 20.8 | — | 1.160 | 0.365 | 0.126 | 2.176 | — | 26.2 | OK |
| 1-21 | ○ | X | 447.9 | 170.5 | 360.1 | 5.0 | — | 1.185 | 0.381 | 0.029 | 2.112 | — | 26.3 | OK |
| 1-22 | ○ | X | 469.5 | 171.6 | 363.6 | 40.1 | — | 1.140 | 0.366 | 0.234 | 2.119 | — | 25.6 | OK |
| 1-23 | ○ | X | 493.6 | 221.2 | 362.1 | 41.7 | — | 1.182 | 0.488 | 0.189 | 1.637 | — | 28.2 | OK |
| 1-24 | ○ | X | 498.5 | 270.5 | 358.2 | 10.0 | — | 1.261 | 0.543 | 0.037 | 1.324 | — | 24.5 | OK |
| 1-25 | ○ | X | 516.6 | 270.8 | 361.3 | 39.8 | — | 1.224 | 0.524 | 0.147 | 1.334 | — | 26.2 | OK |
| 1-26 | ○ | X | 502.7 | 365.1 | 312.7 | 14.8 | — | 1.348 | 0.726 | 0.041 | 0.856 | — | 27.0 | OK |
| 1-27 | ○ | X | 406.7 | 421.3 | 188.5 | 15.0 | — | 1.500 | 1.036 | 0.036 | 0.447 | — | 26.3 | OK |
| 1-28 | ○ | X | 446.3 | 492.6 | 180.0 | 39.9 | — | 1.507 | 1.104 | 0.081 | 0.365 | — | 27.2 | OK |
| 1-29 | ○ | X | 483.8 | 632.4 | 160.0 | 15.1 | — | 1.638 | 1.307 | 0.024 | 0.253 | — | 26.3 | OK |
| 1-30 | ○ | X | 517.5 | 643.1 | 188.3 | 15.2 | — | 1.607 | 1.243 | 0.024 | 0.293 | — | 24.0 | OK |
| 1-31 | ○ | X | 484.6 | 684.6 | 119.7 | 45.2 | — | 1.660 | 1.413 | 0.066 | 0.175 | — | 25.0 | OK |
| 1-32 | ○ | X | 508.2 | 743.5 | 121.3 | 30.2 | — | 1.702 | 1.463 | 0.041 | 0.163 | — | 26.9 | OK |
| 1-33 | ○ | X | 517.2 | 775.0 | 119.6 | 20.2 | — | 1.730 | 1.498 | 0.026 | 0.154 | — | 27.8 | OK |
| 1-34 | ○ | X | 523.5 | 797.3 | 116.3 | 17.0 | — | 1.745 | 1.523 | 0.021 | 0.146 | — | 25.7 | OK |
| 1-35 | ○ | X | 532.4 | 831.7 | 109.1 | 14.9 | — | 1.767 | 1.562 | 0.018 | 0.131 | — | 25.6 | NG |
| 1-36 | ○ | X | 533.6 | 842.2 | 105.0 | 15.0 | — | 1.775 | 1.578 | 0.018 | 0.125 | — | 26.0 | NG |
| 1-37 | ○ | X | 535.6 | 849.9 | 102.6 | 16.0 | — | 1.779 | 1.587 | 0.019 | 0.121 | — | 27.7 | NG |
| 1-38 | X | X | 448.2 | 147.9 | 363.2 | 22.0 | — | 1.140 | 0.330 | 0.149 | 2.456 | — | 32.4 | OK |
| 1-39 | X | X | 515.1 | 268.4 | 360.8 | 40.2 | — | 1.222 | 0.521 | 0.150 | 1.344 | — | 31.2 | OK |
| 2-1 | ○ | ○ | 455.0 | 119.1 | 385.0 | 20.8 | 10.1 | 1.108 | 0.262 | 0.175 | 3.233 | 0.085 | 29.2 | OK |
| 2-2 | ○ | ○ | 455.9 | 120.2 | 385.8 | 20.0 | 25.4 | 1.110 | 0.264 | 0.166 | 3.210 | 0.211 | 28.5 | OK |
| 2-3 | ○ | ○ | 454.9 | 120.0 | 384.9 | 19.9 | 40.0 | 1.110 | 0.264 | 0.166 | 3.208 | 0.333 | 24.1 | OK |
| 2-4 | ○ | ○ | 455.2 | 119.9 | 385.0 | 20.5 | 65.2 | 1.109 | 0.263 | 0.171 | 3.211 | 0.544 | 23.4 | OK |
| 2-5 | ○ | ○ | 454.7 | 118.8 | 385.1 | 20.4 | 90.2 | 1.108 | 0.261 | 0.172 | 3.242 | 0.759 | 22.5 | OK |
| 2-6 | ○ | ○ | 454.1 | 120.4 | 383.6 | 20.6 | 95.0 | 1.110 | 0.265 | 0.171 | 3.186 | 0.789 | 22.3 | OK |

Table 1 above shows dimension data of respective parts of the multilayered ceramic capacitor 100, measured based on an image obtained by scanning a cross-section of the ceramic body 110, cut in the length direction (L) and thickness direction (T) in the center of the ceramic body 110 in the width direction (W), in the multilayered ceramic capacitor 100, using a scanning electron microscope (SEM), as shown in FIG. 3.

Here, as described above, A was defined as ½ of an overall thickness of the ceramic body 110, B was defined as a thickness of the lower cover layer 113, C was defined as ½ of an overall thickness of the active layer 115, and D was defined as a thickness of the upper cover layer 112.

In addition, in another embodiment in which the dummy patterns 125 are provided in the lower cover layer 113, E was defined as overall thickness of the dummy patterns 125.

In order to measure acoustic noise, one sample (multilayered ceramic capacitor) per a substrate for measuring acoustic noise was mounted on a printed circuit board while upper and lower directions of the sample were differentiated from each other, and then the printed circuit board was seated on a measuring jig.

In addition, DC voltage and voltage variation were applied to both terminals of the sample seated on the measuring jig by using a DC power supply and a function generator.

In addition, acoustic noise was measured through a microphone installed directly above the printed circuit board.

In Table 1 above, Samples 1-1 to 1-3 are comparative examples each having a cover symmetrical structure in which the thickness (B) of the lower cover layer 113 is approximately similar to the thickness (D) of the upper cover layer 112, and Samples 1-4 to 1-14 are comparative examples each having a structure in which the thickness (D) of the upper cover layer 112 is thicker than the thickness (B) of the lower cover layer 113.

In addition, Sample 1-15 is a comparative example having a structure in which the thickness (B) of the lower cover layer 113 is thicker than the thickness (D) of the upper cover layer 112 but the ratio of D/B is 0.552, deviating from the upper limit of the embodiment, 0.425. In addition, Samples 1-35 to 1-37 are comparative examples each having a structure in which the thickness (B) of the lower cover layer 113 is thicker than the thickness (D) of the upper cover layer 112 but the ratio of D/B is below 0.021.

In addition, Samples 1-38 and 1-39 are comparative examples in which dimensional relationships between components included in the multilayered ceramic capacitor satisfy the numerical ranges according to the embodiment of the present invention but the dummy electrodes 123 and 124 are not formed in the active layer 115.

In addition, Samples 1-16 to 1-34 are inventive examples in which the dummy electrodes 123 and 124 are formed in the active layer 115 according to an embodiment of the present invention and all the dimensional relationships of the components included in the multilayered ceramic capacitor of the present invention satisfy the numerical ranges.

Samples 2-1 to 2-6 are multilayered ceramic capacitors each having a structure in which the dummy electrodes 123 and 124 are formed in the active layer 115 and the dummy patterns 125 are formed in the lower cover layer 113, according to another embodiment of the present invention. Among them, Samples 2-1 and 2-2 are comparative examples in which the ratio of the overall thickness of the dummy patterns 125 to the thickness of the lower cover layer 113 deviates from the lower limit of the numerical range of the present embodiment, 0.3. Samples 2-3 to 2-6 are inventive examples in which the ratio of the overall thickness of the dummy patterns 125 to the thickness of the lower cover layer 113 satisfies the numerical range of the present embodiment Here, if the value of (B+C)/A is almost 1, it means that the center portion of the active layer 115 does not largely deviate from the center portion of the ceramic body 110.

It can be seen that, in each of Samples 1-1 to 1-3 having a cover symmetrical structure in which the thickness (B) of the lower cover layer 113 is approximately similar to the thickness (D) of the upper cover layer 112, the value of (B+C)/A thereof was approximately 1 and the acoustic noise was high, 30 dB or higher.

Here, if the value of (B+C)/A is greater than 1, it may mean that the center portion of the active layer 115 upwardly deviates from the center portion of the ceramic body 110, and if the value of (B+C)/A is lower than 1, it may mean that the center portion of the active layer 115 downwardly deviates from the center portion of the ceramic body 110. Referring to Table 1 above, it can be confirmed that in each of Samples 1-16 to 1-34 as the inventive examples in which the ratio of deviation between the center portion of the active layer 115 and the center portion of the ceramic body 110, (B+C)/A, satisfies 1.063≤(B+C)/A≤1.745, the acoustic noise was largely reduced to be below 30 dB.

In addition, each of Samples 1-1 to 1-15 in which the ratio of deviation between the center portion of the active layer 115 and the center portion of the ceramic body 110, (B+C)/A, is lower than 1.063, has a structure in which the center portion of the active layer 115 scarcely deviates from the center portion of the ceramic body 110 or the center portion of the active layer 115 downwardly deviates from the center portion of the ceramic body 110.

Here, it can be seen that, in each of Samples 1-1 to 1-15 in which the (B+C)/A value is lower than 1.063, the acoustic noise was 30 dB or higher and thus the effect of reducing acoustic noise was little in comparison with Samples 1-16 to 1-34 as the inventive examples according to the present invention.

In addition, in Samples 1-35 to 1-37 in which the ratio of deviation between the center portion of the active layer 115 and the center portion of the ceramic body 110, (B+C)/A, is greater than 1.745, the acoustic noise was 30 dB or lower, which was stable, but the capacitance to target capacitance was low, causing defective capacitance.

In Table 1 above, if "NG" is marked in the column "Capacitance Implementation Ratio" (that is, the ratio of capacitance to target capacitance) in Samples 1-35 to 1-37, it means defective capacitance in which the value of capacitance to target capacitance is lower than 80% when the target capacitance value is 100%.

Meanwhile, it can be seen that this result is applied to the ratio between the thickness of the upper cover layer 112 and the thickness of the lower cover layer 113.

That is, it can be seen that, in the inventive examples in which the ratio of the thickness (D) of the upper cover layer 112 to the thickness (B) of the lower cover layer 113, D/B, satisfies 0.021≤D/B≤0.425, the acoustic noise was remarkably reduced.

Whereas, it can be seen that, in the samples 1-1 to 1-15 as the comparative examples in which the ratio of the thickness (D) of the upper cover layer 112 to the thickness (B) of the lower cover layer 113, D/B, is greater than 0.425, the effect of reducing acoustic noise was little.

If the ratio of the thickness (D) of the upper cover layer 112 to the thickness (B) of the lower cover layer 113, D/B, is lower than 0.021, the thickness (D) of the upper cover layer 112 is excessively greater than t the thickness (B) of the lower cover layer 113, resulting in crack or delamination, and the capacitance to target capacitance may be low, causing defective capacitance.

It can be seen that, in Samples 1-20 to 1-34 as the inventive examples in which the ratio of the thickness (B) of the lower cover layer 113 to ½ (A) of the overall thickness of the ceramic body 110, B/A, and the ratio of ½ (C) of the overall thickness of the active layer 115 to the thickness (B) of the lower cover layer 113, C/B, satisfy, 0.365≤B/A≤1.523 and 0.146≤C/B≤2.176, respectively, the acoustic noise values thereof were lower than 28.5 dB, which was further reduced in comparison with Samples 1-16 to 1-19.

Whereas, in Samples 1-35 to 1-37 in which the ratio of the thickness of the lower cover layer 113 (B) to ½ (A) of the thickness of the ceramic body 110, B/A, is greater than 1.523 or the ratio of the ratio of ½ (C) of the overall thickness of the active layer 115 to the thickness (B) of the lower cover layer 113, C/B, is lower than 0.146, the capacitance in comparison with target capacitance was low, causing defective capacitance.

Meanwhile, it can be seen that, in Samples 2-1 to 2-6 in which the first and second dummy electrodes 123 and 124 are formed inside the active layer 115 and the dummy patterns 125 are formed inside the lower cover layer 113, according to another embodiment of the invention, the acoustic noise values thereof were at levels below 30 dB, reduced in comparison with the foregoing comparative examples, Samples 1-1 to 1-15.

In particular, it can be seen that, in Samples 2-3 to 2-6 in which the ratio of the overall thickness (E) of the dummy patterns 125 to the thickness (B) of the lower cover layer 113 is 0.3 or higher, the acoustic noise values thereof were lower than 25 dB, which was further reduced in comparison with Samples 2-1 and 2-2.

Therefore, it can be seen that, when the dummy patterns 125 are formed in the lower cover layer 113 and the ratio of the overall thickness (E) of the dummy patterns 125 to the thickness (B) of the lower cover layer 113 is 0.3 or higher, the acoustic noise can be more effectively improved.

Figure 5:
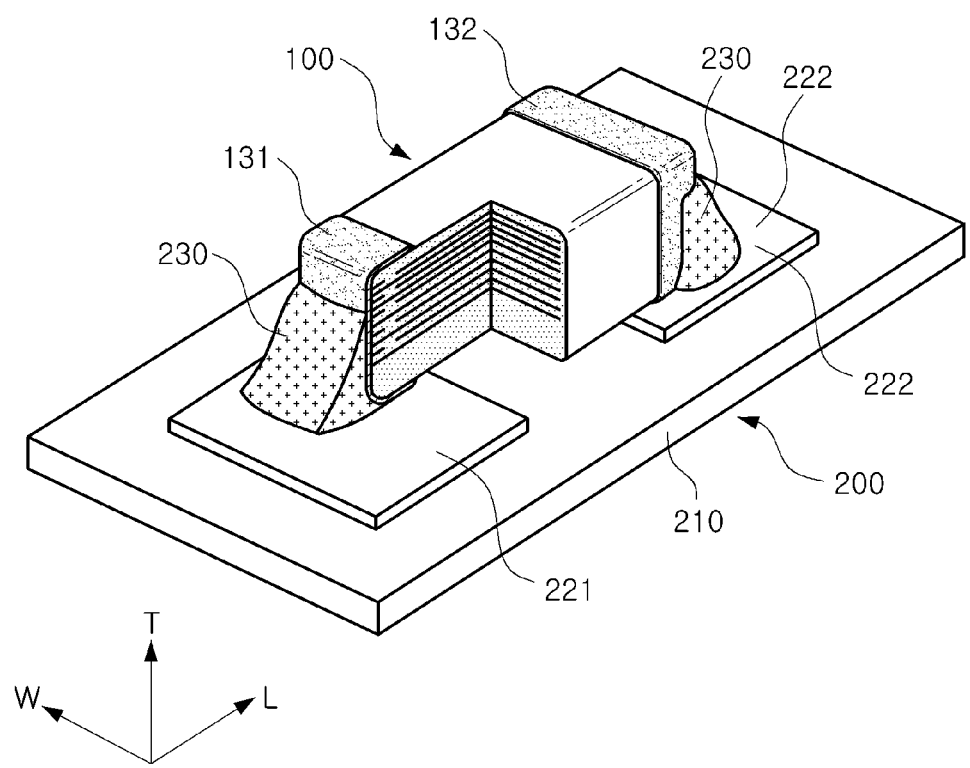
FIG. 5 is a perspective view showing a state in which the multilayered ceramic capacitor of FIG. 1 is mounted on a printed circuit board.
Figure 6:
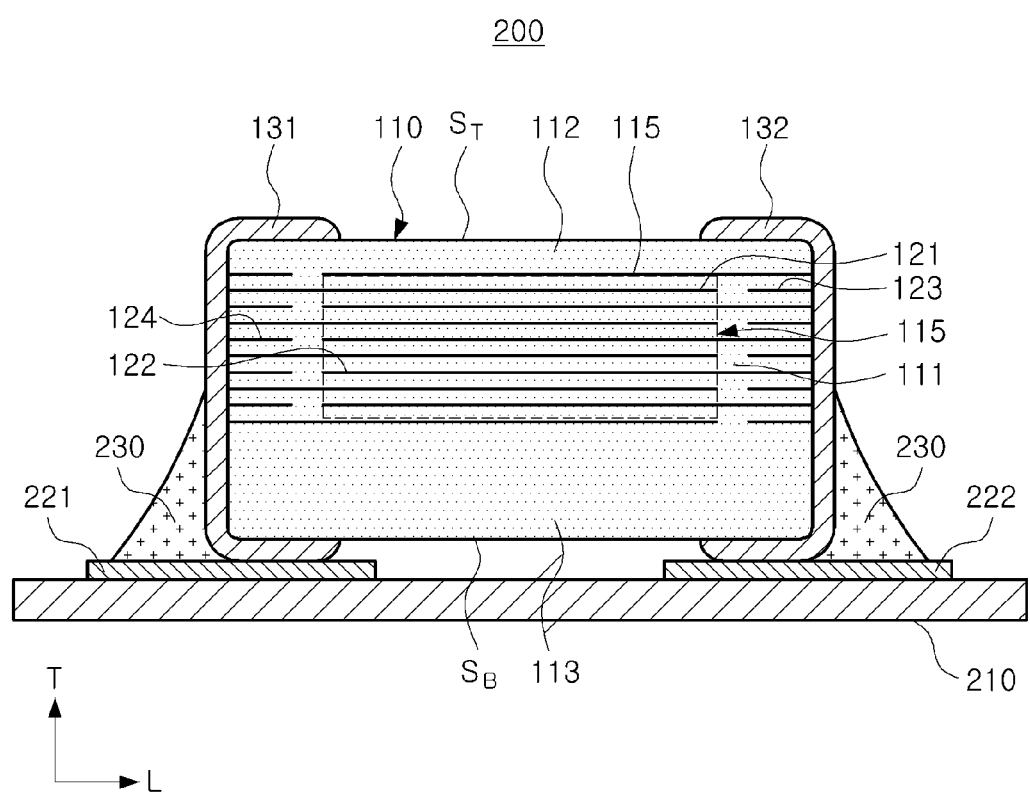
FIG. 6 is a cross-sectional view showing the multilayered ceramic capacitor and printed circuit board of FIG. 5, cut along the length direction thereof.

Mounting Structure of Circuit Board Having Thereon Multilayered Ceramic Capacitor Referring to FIGS. 5 and 6, a mounting board 200 for the multilayered ceramic capacitor 100 according to the present embodiment may include a printed circuit board 210 on which the multilayered ceramic capacitor 100 is horizontally mounted; and first and second electrode pads 221 and 222 spaced apart from each other on an upper surface of the printed circuit board 210.

Here, the multilayered ceramic capacitor 100 may be electrically connected to the printed circuit board 210 by soldering 230 while the lower cover layer 113 is located below and the first and second external electrodes 131 and 132 are positioned on and contacted with the first and second electrode pads 221 and 222, respectively.

When voltage is applied while the multilayered ceramic capacitor 100 is mounted on the printed circuit board 210 as described above, acoustic noise may be generated.

Here, the size of the first and second electrode pads 221 and 222 may be an index for determining the amount of soldering 230 which connects between the first and second external electrodes 131 and 132 of the multilayered ceramic capacitor 100 and the first and second electrode pads 221 and 222, and the level of acoustic noise may be controlled depending on the amount of soldering 230.

Figure 7:
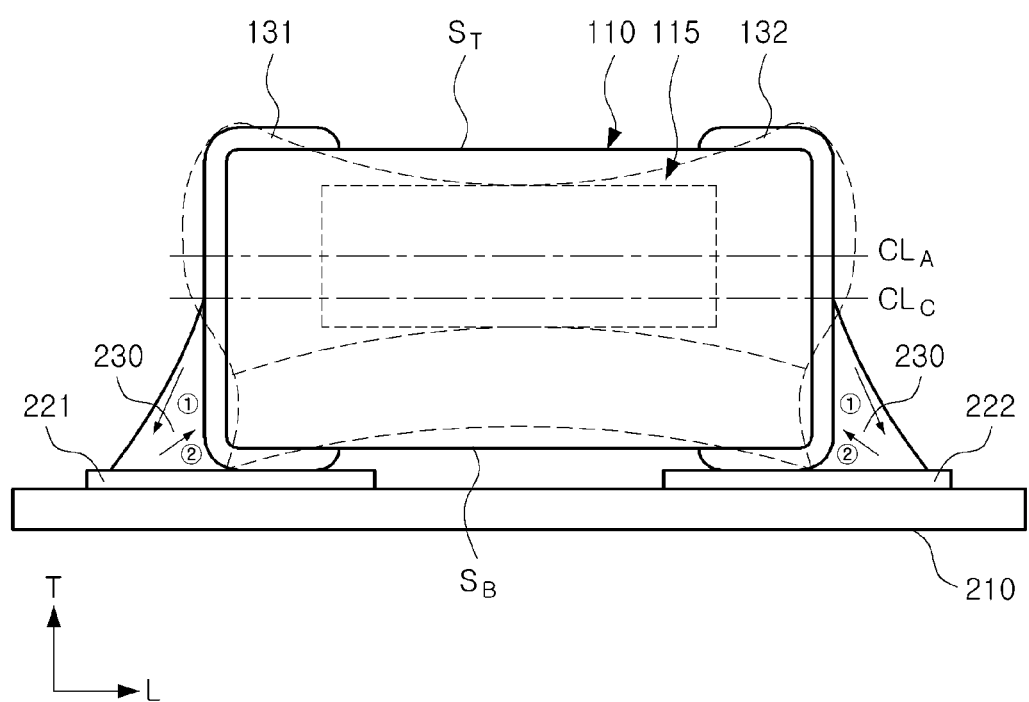
FIG. 7 is a cross-sectional view schematically showing a state in which the multilayered ceramic capacitor of FIG. 5 is transformed by voltage applied thereto while the multilayered ceramic capacitor is mounted on the printed circuit board.

Referring to FIG. 7, when voltages having different polarities are applied to the first and second external electrodes 131 and 132 formed on both end portions of the multilayered ceramic capacitor 100 while the multilayered ceramic capacitor 100 is mounted on the printed circuit board 210, the ceramic body 110 expands or shrinks in the thickness direction thereof due to an inverse piezoelectric effect of the dielectric layers 111, and both ends of the first and second external electrodes 131 and 132 expand and shrink, contrary to the expansion and shrinkage of the ceramic body 110 in the thickness direction, due to the Poisson effect.

Here, the center portion of the active layer 115 significantly expands and shrinks from both end portions of the first and second external electrodes 131 and 132 in the length direction, thereby causing acoustic noise.

When both end surfaces in the length direction of the multilayered ceramic capacitor 100 significantly expands, a force (①) of allowing an upper portion of the soldering 230 to be pushed out to the outside is generated due to expansion and a shrinkage force (②) of allowing a lower portion of the soldering 230 to be pushed to the external electrode is generated due to the force (①).

Therefore, when points of inflection formed on respective end surfaces of the ceramic body 110 is formed to have a height corresponding to or lower than the soldering 23 due to a difference between a deformation rate occurring in the central portion of the active layer 115 $CL_A$ and a deformation rate occurring in the lower cover layer 113, during the application of voltage, acoustic noise can be further reduced.

In addition, when an electric field is applied to a margin part of the multilayered ceramic capacitor in the length direction, the first and second dummy electrodes 123 and 124 expand, contrary to the shrinkage of the head parts of the first and second external electrodes 131 and 132 in the length direction due to the Poisson effect. Thus, this expansion is offset by the shrinkage of the first and second external electrodes 131 and 132, and thus vibrations generating in the head parts of the first and second external electrodes 131 and 132 may be reduced, and resultantly, acoustic noise is further reduced.

Packing Unit for Multilayered Ceramic Capacitor

Figure 8:
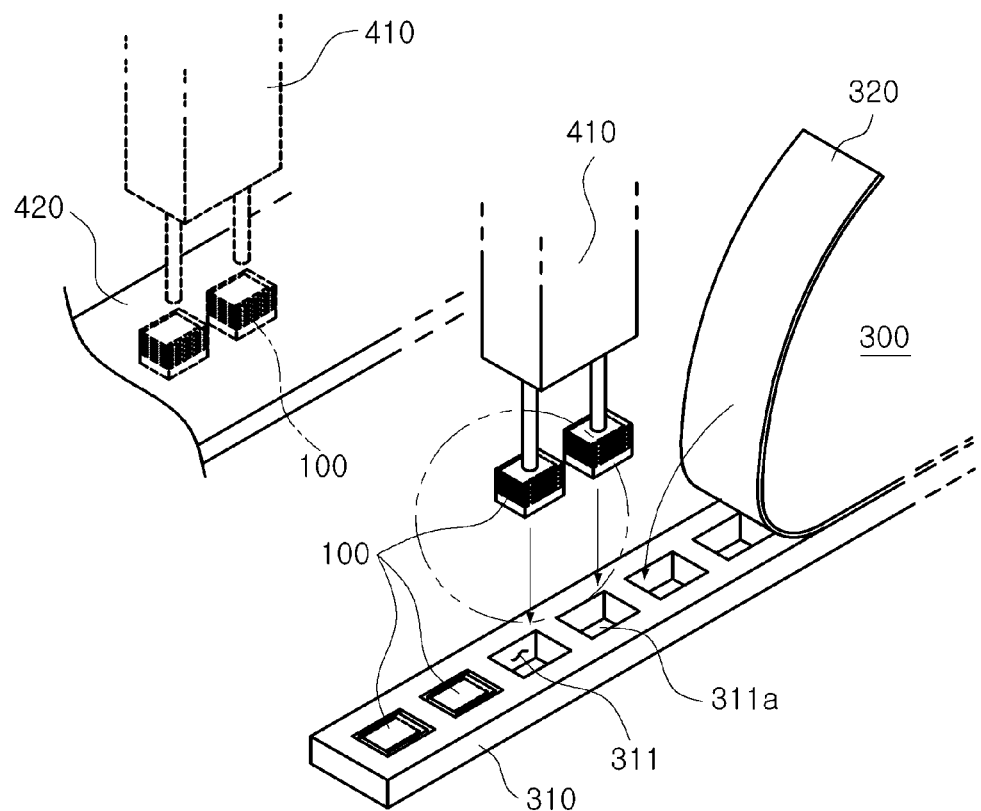
FIG. 8 is a perspective view schematically showing a state in which the multilayered ceramic capacitor according to the embodiment of the present invention is mounted on a packaging unit.

Referring to FIG. 8, a packing unit 300 for a multilayered chip capacitor according to the present embodiment may include a packing sheet 310 having a plurality of receiving parts 311 formed to correspond to multilayered ceramic capacitors 100 so as to receive multilayered ceramic capacitors 100 therein, respectively.

Here, the respective multilayered ceramic capacitors 100 are maintained by an electronic product arranging apparatus 420 such that the first and second internal electrodes 121 and 122 are horizontally arranged, and may be conveyed to the packing sheet 310 by using a conveying apparatus 410.

The thus conveyed multilayered ceramic capacitors 100 may be received in the receiving parts 311 such that respective lower cover layers 113 of the multilayered ceramic capacitors 100 face a bottom surface 311a of the receiving part 311.

In addition, a packing film 320 may be attached to one surface of the packing sheet 310 so as to seal the receiving parts 311 in which the multilayered ceramic capacitors 100 are respectively received.

Figure 9:
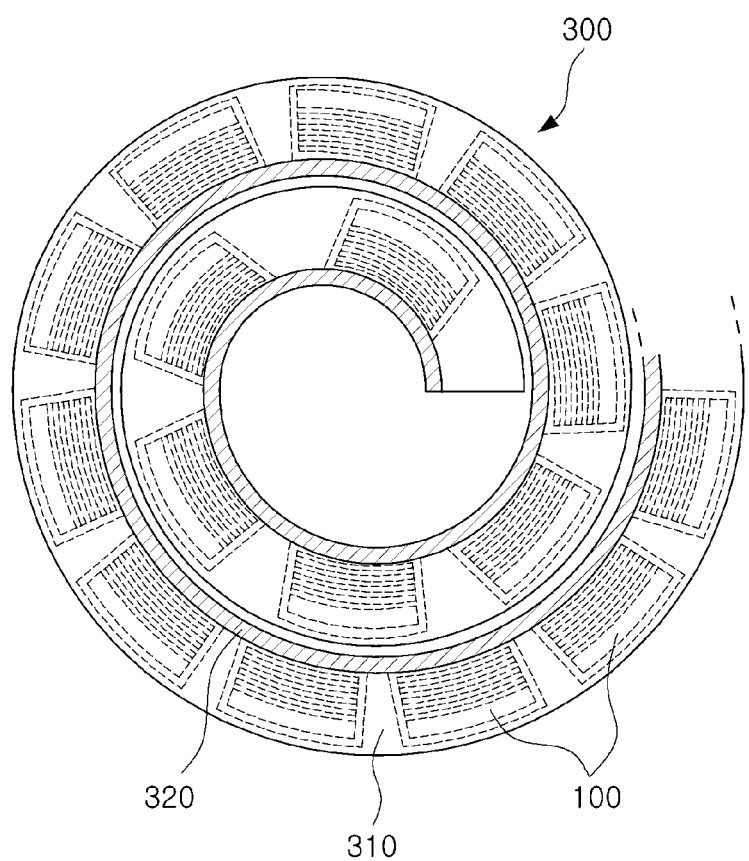
FIG. 9 is a cross-sectional view schematically showing a state in which the packaging unit of FIG. 8 is wound in a reel shape.

Meanwhile, referring to FIG. 9, the formed packing sheet 310 may be continuously wound as a reel.

As set forth above, according to the embodiments of the invention, the dummy electrodes are formed in the active layer, so that vibrations generated in the multilayered ceramic capacitor can be suppressed by expansion of the dummy electrodes in the length direction, and thus acoustic noise generated in the printed circuit board can be remarkably reduced.

While the present invention has been shown and described in connection with the embodiments, it will be apparent to those skilled in the art that modifications and variations can be made without departing from the spirit and scope of the invention as defined as the appended claims.

What is claimed is:

1. A multilayered ceramic capacitor, comprising:
a ceramic body having a plurality of dielectric layers laminated therein;
an active layer including a plurality of first and second internal electrodes having the respective dielectric layers interposed therebetween to form capacitance, the first and second internal electrodes being alternately exposed through both end surfaces of the ceramic body;
an upper cover layer formed above the active layer;
a lower cover layer formed below the active layer and having a thickness larger than a thickness of the upper cover layer;
first and second external electrodes covering both end surfaces of the ceramic body; and
a plurality of first and second dummy electrodes extended from the first and second external electrodes inwardly in a length direction to thereby face the first and second internal electrodes, respectively, in the active layer,
wherein, when A is defined as ½ of an overall thickness of the ceramic body, B is defined as the thickness of the lower cover layer, C is defined as ½ of an overall thickness of the active layer, and D is defined as the thickness of the upper cover layer, a ratio of deviation between a center portion of the active layer and a center portion of the ceramic body, (B+C)/A, satisfies $1.063 \leq (B+C)/A \leq 1.745$,
wherein the lower cover layer includes dummy patterns, the dummy patterns including first and second dummy patterns extended from the first and second external electrodes inwardly in the length direction to thereby face each other, respectively,
wherein when E is defined as an overall thickness of the dummy patterns, a ratio of the overall thickness E of the dummy patterns to the thickness B of the lower cover layer, E/B, satisfies $0.3 \leq E/B < 1$.

2. The multilayered ceramic capacitor of claim 1, wherein a ratio of the thickness (D) of the upper cover layer to the thickness (B) of the lower cover layer, D/B, satisfies $0.021 \leq D/B \leq 0.425$.

3. The multilayered ceramic capacitor of claim 1, wherein a ratio of the thickness (B) of the lower cover layer to ½ (A) of the overall thickness of the ceramic body, B/A, satisfies $0.365 \leq B/A \leq 1.523$.

4. The multilayered ceramic capacitor of claim 1, wherein a ratio of ½ (C) of the overall thickness of the active layer to the thickness (B) of the lower cover layer, C/B, satisfies 0.146≤C/B≤2.176.

5. The multilayered ceramic capacitor of claim 1, wherein the first and second dummy patterns are formed to have the same length.

6. The multilayered ceramic capacitor of claim 1, wherein points of inflection formed on respective end surfaces of the ceramic body are formed to have a height corresponding to or lower than a center portion of the ceramic body in a thickness direction, due to a difference between a deformation rate occurring in the central portion of the active layer and a deformation rate occurring in the lower cover layer, during an application of voltage.

7. A mounting structure of a circuit board having a multilayered ceramic capacitor thereon, the mounting structure comprising:
a printed circuit board having first and second electrode pads formed thereon; and
a multilayered ceramic capacitor mounted on the printed circuit board,
the multilayered ceramic capacitor including: a ceramic body having a plurality of dielectric layers laminated therein; an active layer including a plurality of first and second internal electrodes having the respective dielectric layers interposed therebetween to form capacitance, the first and second internal electrodes being alternately exposed through both end surfaces of the ceramic body; an upper cover layer formed above the active layer; a lower cover layer formed below the active layer and having a thickness larger than a thickness of the upper cover layer; first and second external electrodes formed on the both end surfaces of the ceramic body, electrically connected to exposed portions of the first and second internal electrodes, and connected to the first and second electrode pads through soldering; and a plurality of first and second dummy electrodes extended from the first and second external electrodes inwardly in a length direction to thereby face the first and second internal electrodes, respectively, in the active layer,
wherein, when A is defined as ½ of an overall thickness of the ceramic body, B is defined as the thickness of the lower cover layer, C is defined as ½ of an overall thickness of the active layer, and D is defined as the thickness of the upper cover layer, a ratio of deviation between a center portion of the active layer and a center portion of the ceramic body, (B+C)/A, satisfies 1.063≤(B+C)/A≤1.745,
wherein the lower cover layer includes dummy patterns, the dummy patterns including first and second dummy patterns extended from the first and second external electrodes inwardly in the length direction to thereby face each other, respectively,
wherein when E is defined as an overall thickness of the dummy patterns, a ratio of the overall thickness E of the dummy patterns to the thickness B of the lower cover layer, E/B, satisfies 0.3≤E/B<1.

8. The mounting structure of claim 7, wherein the lower cover layer includes dummy patterns, the dummy patterns including first and second dummy patterns extended from the first and second external electrodes inwardly in the length direction to thereby face each other, respectively.

9. The mounting structure of claim 7, wherein points of inflection formed on respective end surfaces of the ceramic body are formed to have a height corresponding to or lower than the soldering, due to a difference between a deformation rate occurring in the central portion of the active layer and a deformation rate occurring in the lower cover layer, during an application of voltage.

10. A packing unit for a multilayered ceramic capacitor, the packing unit comprising:
one or more multilayered ceramic capacitors, including: a ceramic body having a plurality of dielectric layers laminated therein; an active layer including a plurality of first and second internal electrodes alternately exposed through both end surfaces of the ceramic body, having the respective dielectric layer interposed therebetween; an upper cover layer formed above the active layer; a lower cover layer formed below the active layer and having a thickness larger than a thickness of the upper cover layer; first and second external electrodes formed on the both end surfaces of the ceramic body and electrically connected to exposed portions of the first and second internal electrodes; and a plurality of first and second dummy electrodes extended from the first and second external electrodes inwardly in a length direction to thereby face the first and second internal electrodes, respectively, in the active layer, wherein, when A is defined as ½ of an overall thickness of the ceramic body, B is defined as the thickness of the lower cover layer, C is defined as ½ of an overall thickness of the active layer, and D is defined as the thickness of the upper cover layer, a ratio of deviation between a center portion of the active layer and a center portion of the ceramic body, (B+C)/A, satisfies 1.063≤(B+C)/A≤1.745, wherein the lower cover layer includes dummy patterns, the dummy patterns including first and second dummy patterns extended from the first and second external electrodes inwardly in the length direction to thereby face each other, respectively, wherein when E is defined as an overall thickness of the dummy patterns, a ratio of the overall thickness E of the dummy patterns to the thickness B of the lower cover layer, E/B, satisfies 0.3≤E/B<1; and
a packing sheet having a plurality of receiving parts in which the multilayered ceramic capacitors are respectively received, the lower cover layer of each multilayered ceramic capacitor facing toward a bottom surface of the receiving parts.

11. The packing unit of claim 10, further comprising a packing film attached to one surface of the packing sheet so as to seal the receiving parts in which the multilayered ceramic capacitors are respectively received.

12. The packing unit of claim 10, wherein the packing sheet is wound as a reel.

* * * * *